United States Patent
Nelles et al.

(10) Patent No.: US 7,759,573 B2
(45) Date of Patent: *Jul. 20, 2010

(54) HYBRID SOLAR CELLS WITH THERMAL DEPOSITED SEMICONDUCTIVE OXIDE LAYER

(75) Inventors: Gabrielle Nelles, Stuttgart (DE); Akio Yasuda, Stuttgart (DE); Hans-Werner Schmidt, Bayreuth (DE); Mukundan Thelakkat, Bayreuth (DE); Christoph Schmitz, Frankfurt am Main (DE)

(73) Assignee: Sony Deutschland GmbH, Cologne (DE)

( * ) Notice: Subject to any disclaimer, the term of this patent is extended or adjusted under 35 U.S.C. 154(b) by 549 days.

This patent is subject to a terminal disclaimer.

(21) Appl. No.: 10/799,257

(22) Filed: Mar. 12, 2004

(65) Prior Publication Data

US 2004/0168718 A1    Sep. 2, 2004

Related U.S. Application Data

(63) Continuation of application No. 09/989,848, filed on Nov. 21, 2001, now Pat. No. 6,706,962.

(30) Foreign Application Priority Data

Nov. 24, 2000    (EP) ................... 00125784

(51) Int. Cl.
*H01L 31/00* (2006.01)
(52) U.S. Cl. ....................... 136/263; 136/256
(58) Field of Classification Search .......... 136/243–265
See application file for complete search history.

(56) References Cited

U.S. PATENT DOCUMENTS 3,927,228 A    12/1975 Pulker
4,164,431 A * 8/1979 Tang .................... 136/263
5,413,959 A * 5/1995 Yamamoto et al. ........ 438/98
5,482,570 A * 1/1996 Saurer et al. ............. 136/255
6,043,428 A * 3/2000 Han et al. ................ 136/263
6,291,763 B1 * 9/2001 Nakamura ................ 136/256

(Continued)

FOREIGN PATENT DOCUMENTS

DE    198 54 938    6/2000

(Continued)

OTHER PUBLICATIONS

Schaafsma T J: "Organic Solar Cells Using Porphyrin Assemblies on Semiconductor Substrates" Solar Energy Materials And Solar Cells, NL, Elsevier Science Publishers, Amsterdam, vol. 38, No. 1/04, Aug. 1, 1995, pp. 349-351, VCONF, XP000683425 ISSN: 0927-0248.

(Continued)

*Primary Examiner*—Jeffrey T Barton
(74) *Attorney, Agent, or Firm*—Oblon, Spivak, McClelland, Maier & Neustadt, L.L.P.

(57) ABSTRACT

Method for producing a hybrid organic solar cell having the general structure
Substrate+EM/HTM/dye/SOL/EM, or
Substrate+EM/SOL/dye/HTM/EM, or
Substrate+EM/HTM/SOL/EM, in which
EM is the electrode material that may be a transparent conductive oxide (TCO) or metal, with at least one of the EM layer(s) of the cell being a TCO,
HTM is the hole transport material,
SOL is a semiconducting oxide layer,
"dye" is a suitable dye, and the SOL layer is vapor deposited.

23 Claims, 6 Drawing Sheets

U.S. PATENT DOCUMENTS

Figure 1:
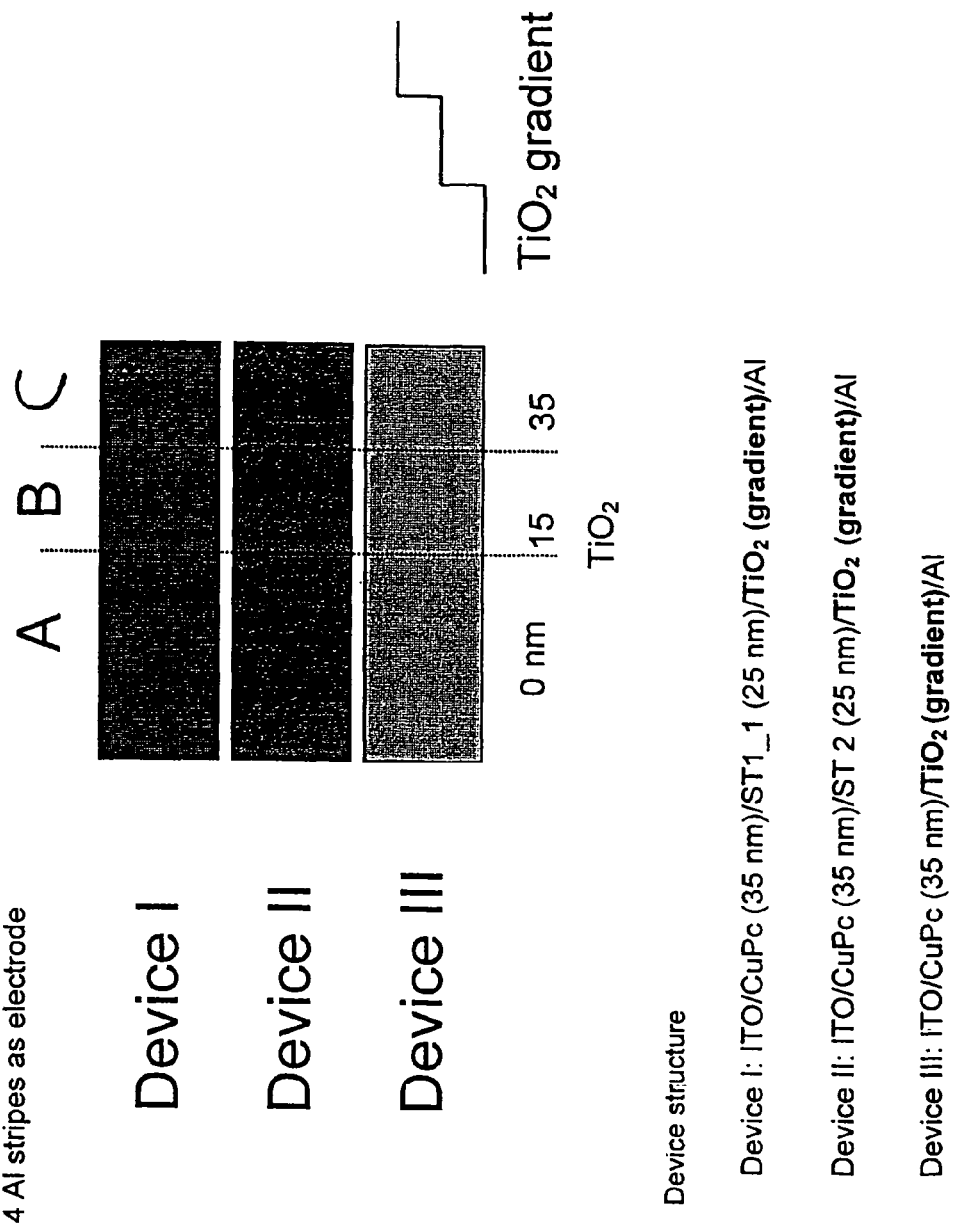

| | | | |
|---|---|---|---|
| 6,303,943 B1 * | 10/2001 | Yu et al. | 257/40 |
| 6,310,282 B1 * | 10/2001 | Sakurai et al. | 136/263 |
| 6,706,962 B2 * | 3/2004 | Nelles et al. | 136/263 |
| 2004/0226602 A1 | 11/2004 | Durr et al. | |
| 2005/0028862 A1 | 2/2005 | Miteva et al. | |
| 2006/0008580 A1 | 1/2006 | Nelles et al. | |
| 2007/0051941 A1 | 3/2007 | Duerr et al. | |
| 2007/0062576 A1 | 3/2007 | Duerr et al. | |
| 2007/0240761 A1 | 10/2007 | Miteva et al. | |
| 2008/0053525 A1 | 3/2008 | Nelles et al. | |
| 2008/0283119 A1 | 11/2008 | Duerr et al. | |
| 2009/0030102 A1 | 1/2009 | Nelles et al. | |

FOREIGN PATENT DOCUMENTS

| | | |
|---|---|---|
| WO | WO 94 03930 | 2/1994 |
| WO | WO 99/49483 * | 9/1999 |

OTHER PUBLICATIONS

Goossens A et al: "Gas-Phase Synthesis of Nanostructured Anatase T102" Chemical Vapor Deposition, DE,VCH:Publishers, Weinheim, vol. 4, No. 3, May 1, 1998, pp. 109-114, XP000766706 ISSN: 0948-1907.

Tang C W: "Two-layer organic photovoltaic cell" Applied Physics Letters, Jan. 13, 1986, USA, vol. 48, No. 2; pp. 183-185, XP002165026 ISSN: 0003-6951.

Pfeiffer M et al: "Controlled p-doping of pigment layers by consublimation: Basic mechanisms and implications for their use in organic photovoltaic cells" Solar Energy Materials and Solar Cells, NL,Elsevier Science Publishers, Amsterdam; vol. 63, No. 1, Jun. 2000, pp. 83-99, XP004201249 ISSN: 0927-0248.

U.S. Appl. No. 12/518,705, filed Jun. 11, 2009, Duerr et al.

* cited by examiner

Figure 2
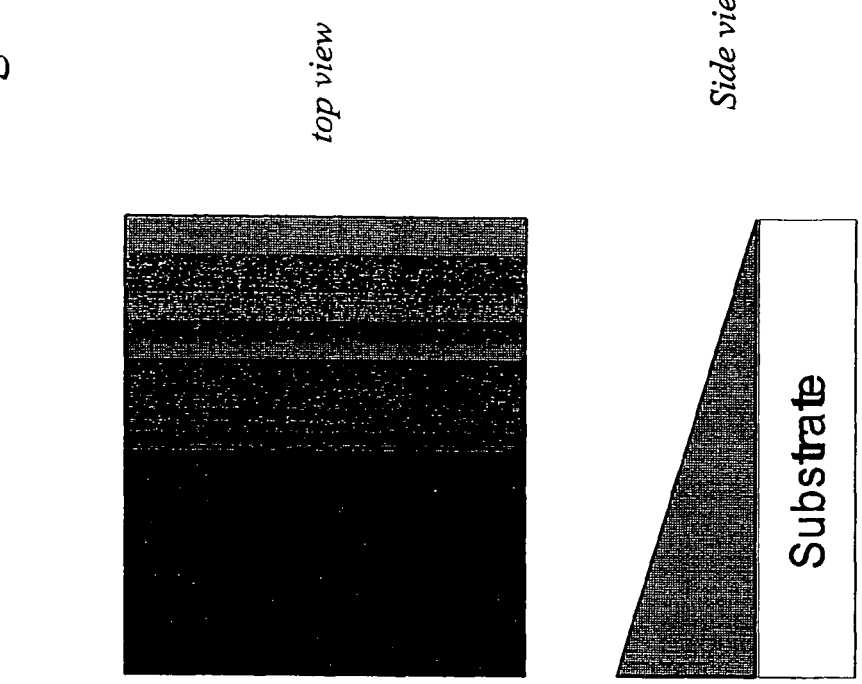
*top view*
*Side view*
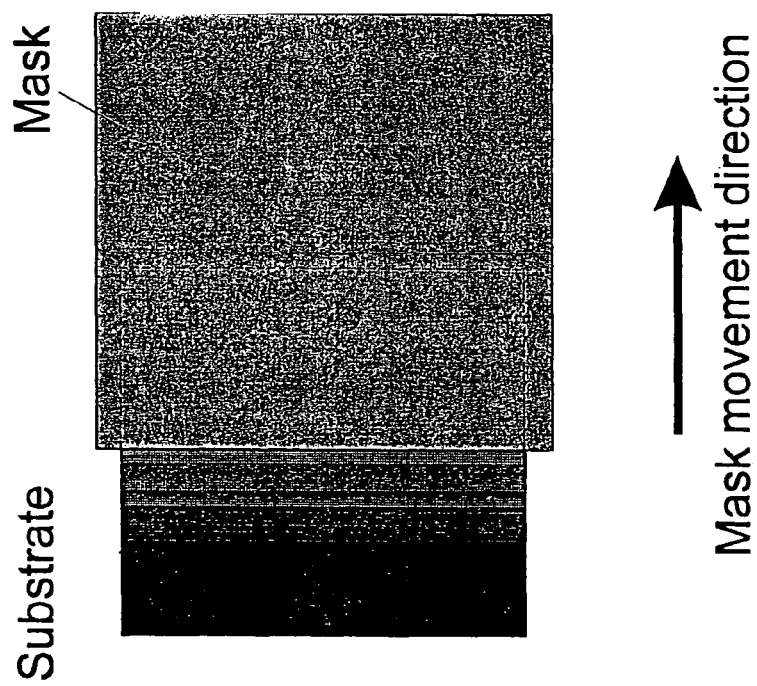

SEM of cell cross section

HYBRID SOLAR CELLS WITH THERMAL DEPOSITED SEMICONDUCTIVE OXIDE LAYER

This application is a continuation of U.S. application Ser. No. 09/989,848 filed on Nov. 21, 2001, now U.S. Pat. No. 6,706,962, and claims benefit of foreign priority to European Application No. EP 00 125 784.9, filed on Nov. 24, 2000.

The present invention is related to the manufacture of organic hybrid solar cells in which the semiconductive oxide layer of the organic hybrid cell is vapour deposited.

Among chief materials used in the past for solar cells have been inorganic semiconductors made from, for example, silicon. However, such devices have proven to be very expensive to construct, due to the melt and other processing techniques necessary to fabricate the semiconductor layer.

In an effort to reduce the cost of solar cells, organic photoconductors and semiconductors have been considered, due to their inexpensive formation by, e.g. thermal evaporation, spin coating, self-assembly, screen printing, spray pyrolysis, lamination and solvent coating. The most often followed strategies in this field can be summarised as follows:

All-organic solar cells produced by vapour deposition are known in the literature. For example, Tang (Tang, Two-layer organic photovoltaic cell, Appl. Phys. Lett. 48(2) (1986) 183-5) reported about organic thin two layer solar cells showing the following structure:

Substrate+ITO/CuPc (30 nm)/ST2 (50 nm)/Ag in which ITO is indium tin oxide, CuPc is copper-phtaltocyanine. ST2 is a dye and in which all organic layers were deposited by evapouration. The deposition by evapouration required source temperatures of about 500 and 600° C., respectively, which the substrate was maintained nominally at room temperature during deposition. The resulting cell is herein designated as "Tang cell". The Tang cell does not include an additional semiconducting oxid layer (SOL) and has an efficiency of 0.96%.

Similarly, Wöhrle et al. and Takahashi et al. reported about organic two and three layer solar cells which were prepared by vapour deposition and/or spin-coating (Wöhrle D., Tennigkeit B., Elbe J., Kreienhoop L., Schnurpfeil G.: Various Porphyrins and Aromatic Terracarbxcylic Acid Diimides in Thin Film p/n-Solar cells, Molecular Crystals and Liquid Crystals 230 (1993B) 221-226 Takahashi, K.; Kuraya, N.; Yamaguchi, T.; Komura, T.; Murata, K. Three-layer organic solar cell with high-power conversion efficiency of 3.5%, Solar Energy Materials & Solar Cells 61 (2000) 403-416). These all organic cells do not contain an SOL layer.

Petrisch and co-workers (Petrisch et al. Dye-based donor/acceptor solar cells, Solar Energy Materials & Solar Cells 61 (2000) 63-72) reported about organic solar cells consisting of three dyes, in particular a perylene-tetracarboxylic acid-bis imide with aliphatic side chains (perylene), a metal-free phtalocyanine with aliphatic side chains (HPc). The materials are soluble which allowed cell performance other than vapour depoition (Yu G., Gao J., Hummelen J. C., Wudl F., Heeger A. J.: Polymer Photovotaic Cells: Enhanced Efficiencies via a network of Internal Donor-Acceptor Heterojunctions, Science 270 (1995) 1789-1791.).

Further, laminated cells or cells containing mixtures of donor and acceptor materials (polymers) were also reported by Friend et al. (Friend et-al., Nature 397 (1999) 121; Granström et al., Nature 395 (1998) 257-260) and Sariciftici et al. (Sariciftici et al. Science 258 (1992) 1474). Schön et al. (Schön et al. Nature 403 (2000) 408-410) reported on the use of single crystals of organic material as doped pentacene having an efficiency of up to 2.4%. Most of the organic solar cells showing a higher efficiency use $I_2/I_3^-$ as a doping system, which is unstable with time.

The use of porous nanocrystalline $TiO_2$ layers in solar cells is further known from WO 91/16719, EP-A-0 333 641 and WO 98/48433 as well as from other publications of Grätzel et al. (Bach U., Lupo D., Comte P., Moser J. E., Weissörtel, F., Solbeck J., Spreitzer H., Graätzel M.: Solid state dye-sensitized porous nanocrystalline $TiO_2$ solar cells with high photon-to-electron conversion efficiencies, Nature 395 (1998) 583-5-85. Bach U., Grätzel M., Salbeck J., Weissortel F., Lupo D.: Photovoltaic Cell, Brian O'Regan and Michael Graätzel: A low cost, high-efficiency solar cell based on desensitized colloidal $TiO_2$ films, Nature 353, (1991) 737-740.) These cells have efficiencies between 0.74% (for the solid state solar cells) and 7.1% (for the liquid hybrid solar cell). Nevertheless, as pointed out by the authors themselves, the liquid cells described in this publications are difficult to produce and have a reduced longterm stability, whilst the solid cells described have a low efficiency. Furthermore, the porous nano-crystalline $TiO_2$ layer preparation requires high temperature sintering with temperatures of 450° C.

U.S. Pat. No. 3,927,228 to Pulker describes a method of depositing titanium dioxide layers by evaporation of a molten titantium-oxygen phase. The method of producing $TiO_2$ layers comprises evaporating a molten titanium-oxygen having a composition corresponding to a proportion of the number of oxygen atoms to the number of titanium atoms of from 1.6 to 1.8, and condensing the vapour on a layer support in the presence of oxygen. The use of this method for the production of solar cells is not disclosed or proposed.

Therefore, most organic/hybrid solar cells known so far show either a low efficiency, a small longterm stability, or they are not suitable to be transferred on flexible substrates. Further, it is still difficult to produce hybrid organic solar cells on large sized carrier substrates.

It is therefore an object of the present invention to provide a solar cell which is both inexpensive to produce and sufficiently efficient as to be useful in terrestrial applications.

It is a related object of the invention to provide a method for the production of a thin, high efficient hybrid solar cell, which can be produced on flexible substrates.

This problem is solved by a method for the production of a hybrid organic solar cell in which the semiconducting oxide layer (SOL) is introduced by thermal deposition. Preferably, the SOL layer is vapour deposited.

The addition of the additional SOL layer can be used to improve the efficiency of known organic solar cells, e.g. the ones as reported by Friend et al. (Friend et al., Nature 397 (1999) 121; Granström et al., Nature 395 (1998) 257-260).

The problem of the invention is further solved by a method for the production of a hybrid organic solar cell having the general structure Substrate+EM/HTM/dye/SOL/EM, or
Substrate+EM/SOL/dye/HTM/EM, or
Substrate+EM/HTM/SOL/EM, in which
EM is the electrode material, selected from the group comprising of a transparent conductive oxide (TCO) and metal, with at least one of the EM layers of the cell being a TCO,
HTM is the hole transport material,
SOL is a semiconducting oxide layer,
"dye" means a suited dye, for example, derivatives of perylenes, and in which the SOL layer of the hybrid solar cell is vapour deposited.

The additional layer of SOL enhances the electron transport to the anode and therefore increases the efficiency of the hybrid organic solar cell according to the invention in comparison with all-organic thin layer solar cells, like the abovementioned "Tang cell". The method according to the invention provides a solar cell which is both inexpensive to produce and sufficiently efficient as to be promising in view of future terrestrial applications.

The problem of the invention is further solved by a method for the production of a hybrid organic solar cell having the general structure
Substrate+EM/HTM/dye/SOL/EM, or
Substrate+EM/SOL/dye/HTM/EM, or
Substrate+EM/HTM/SOL/EM, in which
at least one second layer of the hybrid organic solar cell in addition to the SOL layer is applied by vapour deposition.

The multilayer strategy of the present invention is a promising alternative to the expensive production of solar cells based on single crystal and polycrystalline materials, and a new alternative to the known strategies in the filed of organic solar cells and hybrid solar cells. All other layers of the hybrid organic solar cell can be applied by conventional techniques, e.g. thermal evaporation, spin coating, self-assembly, screen printing, spray pyrolysis, lamination, solvent coating, LB technique, sputtering and others.

In a preferred method of the invention, an additional layer of lithium fluoride can be deposited and/or vapour deposited close to the EM interfaces either on one side or both sides. The additional layer of lithium fluoride can have a thickness of between about 0.1 Å to about 50 Å.

In a further preferred method of the invention, the surfaces of the interfaces of the layers are increased. In general, interfaces can be increased by the following approaches, namely use of structured ITO or other EM, co-evaporation of HTM and dye and/or dye/TiO2 (also in addition to layers of the bare materials) and co-evaporation of HTM and dopant (e$^-$-acceptor, e.g. fullerene).

In a further preferred method of the invention, the substrate is selected from glass, coated glass, polymeric foils, like foils made from PET, PEN or PI (polyimide), norbornene-based foils, $SnO_2$-coated metal foils, e.g. stainless steel foils. Preferably, the substrate is flexible.

In a further preferred method according to the invention EM is selected from the group of indium tin oxide, fluorine doped tin oxide, zinc oxide or doped zinc oxide. Further, in case of a metal, the EM layer can be selected from Au, Al, Ca or Mg or combinations of metals like Al/Li, Mg/Ag and the like. In order to allow a proper function of the solar cell according to the invention, at least one of the EM-layer(s) has to be transparent.

Most preferred is a method, in which EM is indium tin oxide.

According to the invention, HTM can be selected from the group of phthalocyanine and derivatives thereof (with or without a central atom or group of atoms), metal-free and metal containing porphyrins and derivatives thereof, TPD derivatives, triphenylamine and its derivatives, (including different ground structure as TDATAs, TTABs, TDABs, and cyclic variations like N-carbazoles and its derivatives), thiophenes, polythiophenes and derivatives thereof, polyanilines and derivatives thereof and hexabenzocoronene and its derivatives, triphenyldiamine derivatives, aromatic diamine compounds having connected tertiary aromatic amine units of 1,-bis(4-(di-p-tolylamino)phenyl)-cyclohexane, aromatic-diamines containing two or more tertiary amines and having two or more fused aromatic rings substituted on the nitrogen atoms as typified by 4,4-bis[(N–1-naphthyl)-N-phenylamino]-biphenyl, aromatic trimers having a starburst structure derived from triphenylbenzene, aromatic diamines such as N,N'-diphenyl-N,N'-bis(3-methyphenyl)-(1,1'-biphenyl)-4,4'diamine, α,α,α',α'-tetramethyl-α,α'-bis(4-di-p-tolylaminophenyl)-p-xylene, triphenylamine derivatives whose molecule is sterically asymmetric as a whole, compounds having a plurality of aromatic diamino groups substituted on a pyrenyl group, aromatic diamines having tertiary amine units connected through an ethylene group, aromatic diamines having a styryl structure, starburst type aromatic triamines, benzyl-phenyl compounds, compounds having tertiary amine units connected through a fluorene group, triamine compounds, bisdipyridylaminobiophenyl compounds, N,N,N-triphenylamine derivatives, aromatic diamines having a phenoxazine structure, diaminophenylanthridine, and other carbazole derivatives, hydrazoen compounds, silazane compounds, silanamine derivatives, phosphamine derivatives, quinacridone compounds, stilbene compounds such as 4-di-p-tolylamino-stilbene and 4-(di-p-tolylamino)-4'-[4-di-p-tolylamino)-styryl]stilbene, triazole derivatives, oxadiazole derivatives, imidazole derivatives, polyarylalkane derivatives, pyrazoline derivatives, pyrazolone derivatives, oxadiazole derivatives, imidazole derivatives, polyarylalkane derivatives, pyrazoline derivatives, amino-substituted chalcone derivatives, oxazole derivatives, styrylanthracene derivatives, fluorenone derivatives and polysilane derivatives, all compounds alone or in admixture of two or more, polymers, like polyvinyl carbazole and polysilanes, polyphosphazenes, polyamides, polyvinyl triphenylamine, polymers having a triphenylamine skeleton, polymers having triphenylamine units connected through a methylene group and polymethacrylates containing aromatic amine, preferably having an average molecular weight of at least 1,000, more preferably at least –5,000. In general, all kinds of hole transport materials known to the person skilled in the art.

In an even more preferred method according to the invention, HTM is copper-phthalocyanine (CuPc).

The substance of the SOL layer can be selected from the group of all kinds of semiconducting oxides, like $TiO_2$, $SnO_2$, ZnO, $Sb_2O_3$, and PbO.

Most preferred is $TiO_2$.

In a further preferred method of the invention, the dye is selected from the group of di- or monosubstituted perylenes with all possible substituents, e.g. perylene anhydrid, perylene dianhydrides, perylene imides, perylene diimides, perylene imidazoles, perylene diimidazoles and derivatives thereof, terrylene, quinacridone, anthraquinone, nealred, titanylphthalocyanine, porphines and porphyrines and derivatives thereof, polyfluorenes and derivatives thereof and azodyes. In general, all suited and commercially available dyes which are known to the person skilled in the art can be used.

Preferably, the dye layer is deposited in a thickness of about 5 to about 65 nm and the SOL layer is deposited in a thickness of about 5 to about 50 nm. More than one dye can be used in one cell, which can be either applied by a layer-by-layer technique or a co-evaporation of different dyes. The application of several dyes leads to an advantageous broadening of the spectral region in which the absorption takes places.

In a further preferred method according to the invention, the substance of the HTM is doped. Possible approaches for doping can be employed by mixing the material of the HTM layer prior to application with, for example, Tris(4-bromophenyl)ammoniumyl hexachloroantimonate $(N(PhBr)_3 SbCl_6)$, 2,3,5,6-Tetrafluoro-7,7,8,8-tetracyanoquinodimethane (F$_4$-TCNQ) or Nitrosonium-tetrafluorborat (BF$_4$NO). Co-evaporation of dopants like 2,3,5,6-Tetrafluoro-7,7,8,8-tetracyanoquinodimethane (F$_4$-TCNQ) or other electron acceptors is also possible. The dopants can be used in combination with Li-salts, e.g. Bistrifluoromethane sulfonimide Li-salt (Li((CF$_3$SO$_2$)$_2$N)). The dopants can be used in both fully or non-fully evaporated cells.

The problem of the present invention is further solved by a hybrid solar cell which is obtainable by the inventive method, mentioned above.

Preferably the thickness of the complete cell is about 100 nm, and the hybrid solar cell has an efficiency of about 0.7 to about 1.3% at 60 mW/cm$^2$.

Most preferred is a hybrid solar cell according to the invention, which is flexible.

The term "hybrid" is generally known in chemistry as combination of organic and inorganic materials forming any kind of new structure. In the case of photovoltaic cells this term has been introduced for the first time by Hagen et al. (J. Hagen, W. Schaffrath, P. Otschik, R. Fink, A. Bacher, H.-W. Schmidt, L D. Haarer, Synth. Met., 89, 215 (1997).) for describing a dye sensitized solid state solar cell using nanocrystalline TiO$_2$ and TPD derivatives as HTM. Within the invention, the term "thin film hybrid photovoltaic cell" may be used in order to indicate the difference between dye sensitized solar cells with porous nanocrystalline TiO$_2$ and the inventive solar cells with a vapour deposited TiO$_2$ layer.

In general, the inventors developed a new concept to fabricate hybrid organic solar cells. The new idea in this concept is that a SOL layer was introduced into the cell by vapour deposition. All other layers of the hybrid organic solar cell can be applied by conventional techniques, e.g. thermal evaporation, spin coating, self-assembly, screen printing, spray pyrolysis, lamination, solvent coating, LB technique, sputtering and others. In one embodiment of the invention, all layers, or all layers except one or both EM layer(s) are vapour deposited. Compared to the fully organic solar cells consisting of derivatives of phthalocyanin and perylene, an additional layer of TiO$_2$ was introduced. This suprisingly enhances the electron transport to the anode. The resulting cell shows, in one example a configuration of the following structure:

Substrate+ITO/HTM/dye/TiO$_2$/Al, with a total thickness<100 nm.

The advantages of this concept are the low costs, use of purchasable materials with high thermal and electrochemical stability. Furthermore the possibility to prepare large area photovoltaic cells is given and no further temperature treatment is needed, which enables the application to flexible substrates.

To determine the best cell performance, we used the combinatorial method for vapor deposition by varying the TiO$_2$ layer thickness, the CuPc layer thickness, and the thickness of the dye derivatives. Cells were characterized by measuring I-V characteristics of solar cells. The use of TiO$_2$ improved the energy conversion efficiency of solar cells from 0.7 to 1.3% (light of 60 mW/cm$^2$). Further, co-vapor deposition of TiO$_2$ and dye or a modified device structure ITO/TiO$_2$/dye/HTM/Au are possible.

Figure 3:
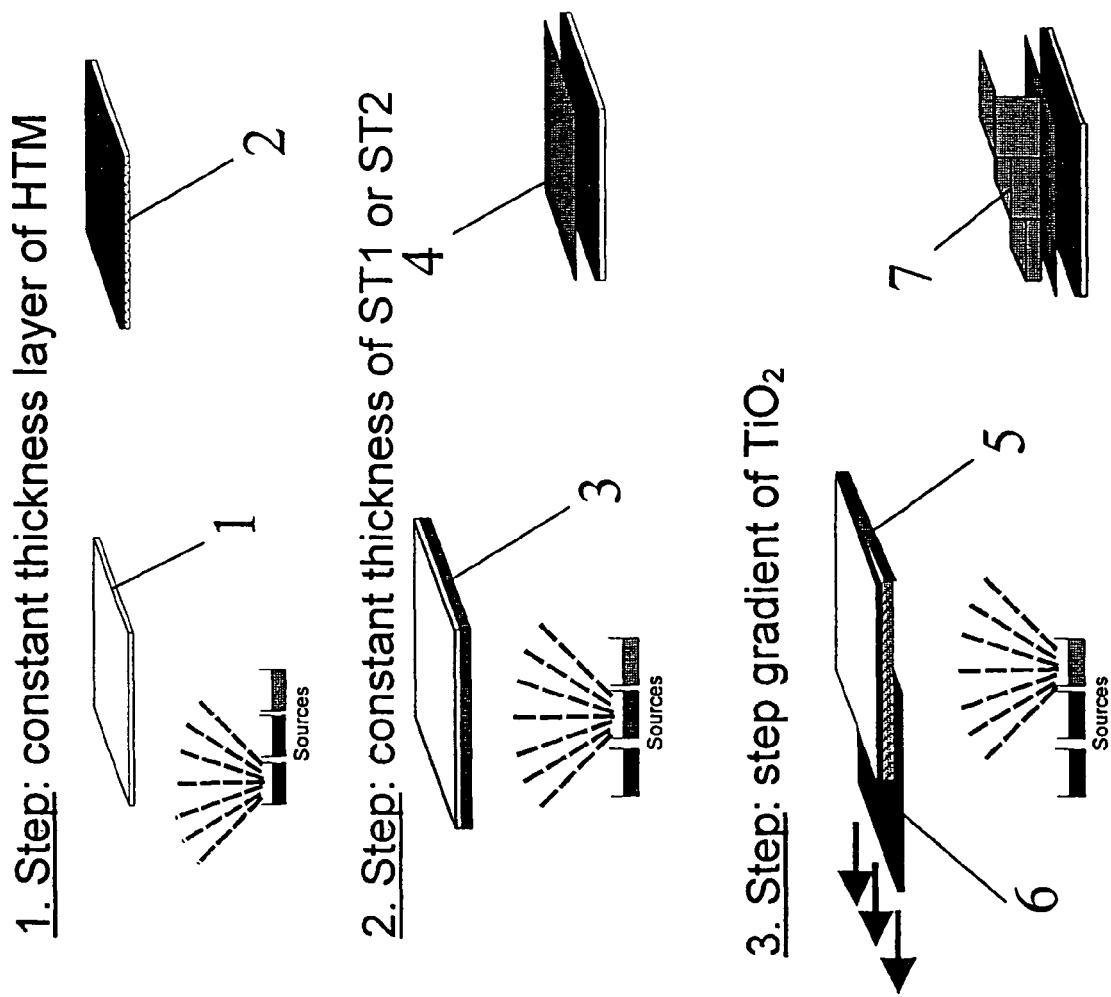
Figure 4:
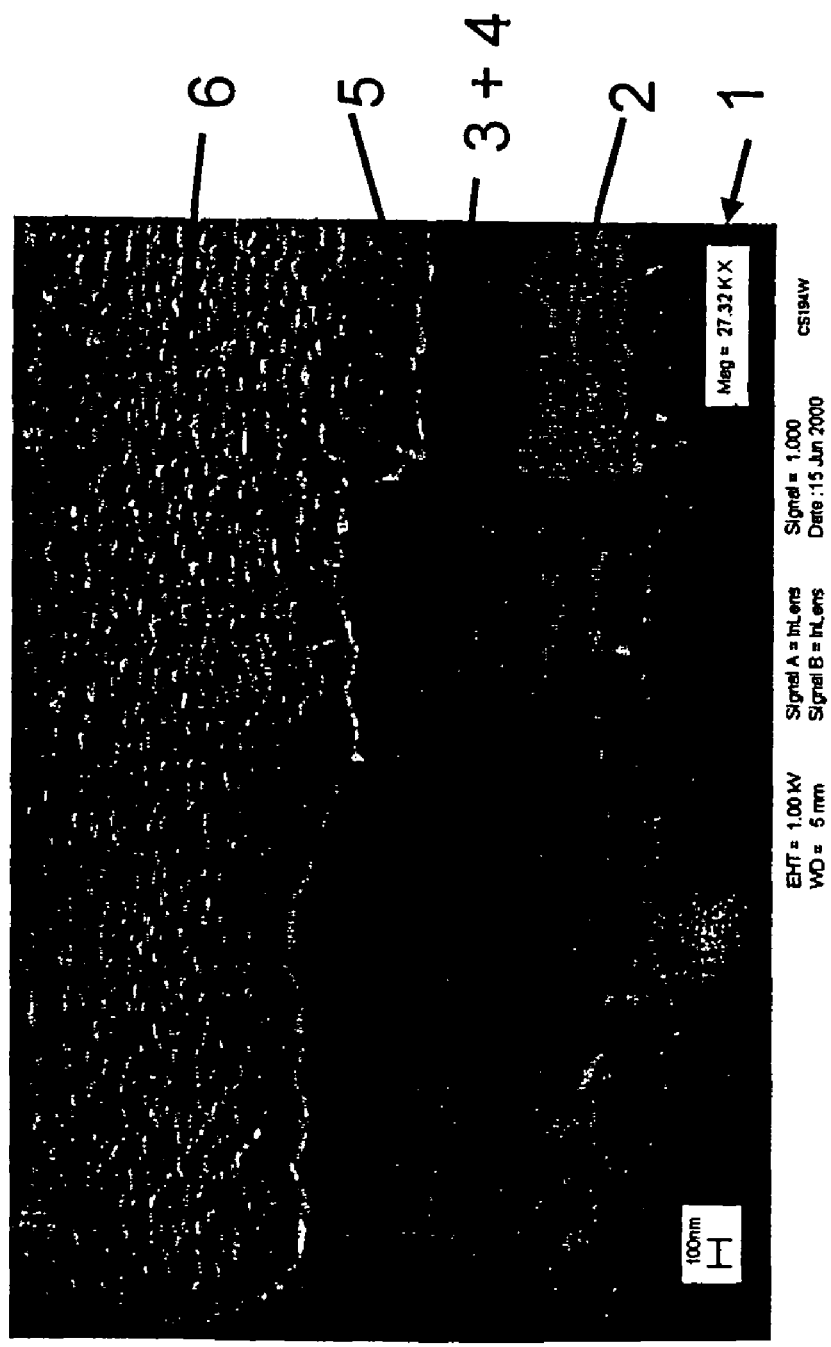
Figure 5:
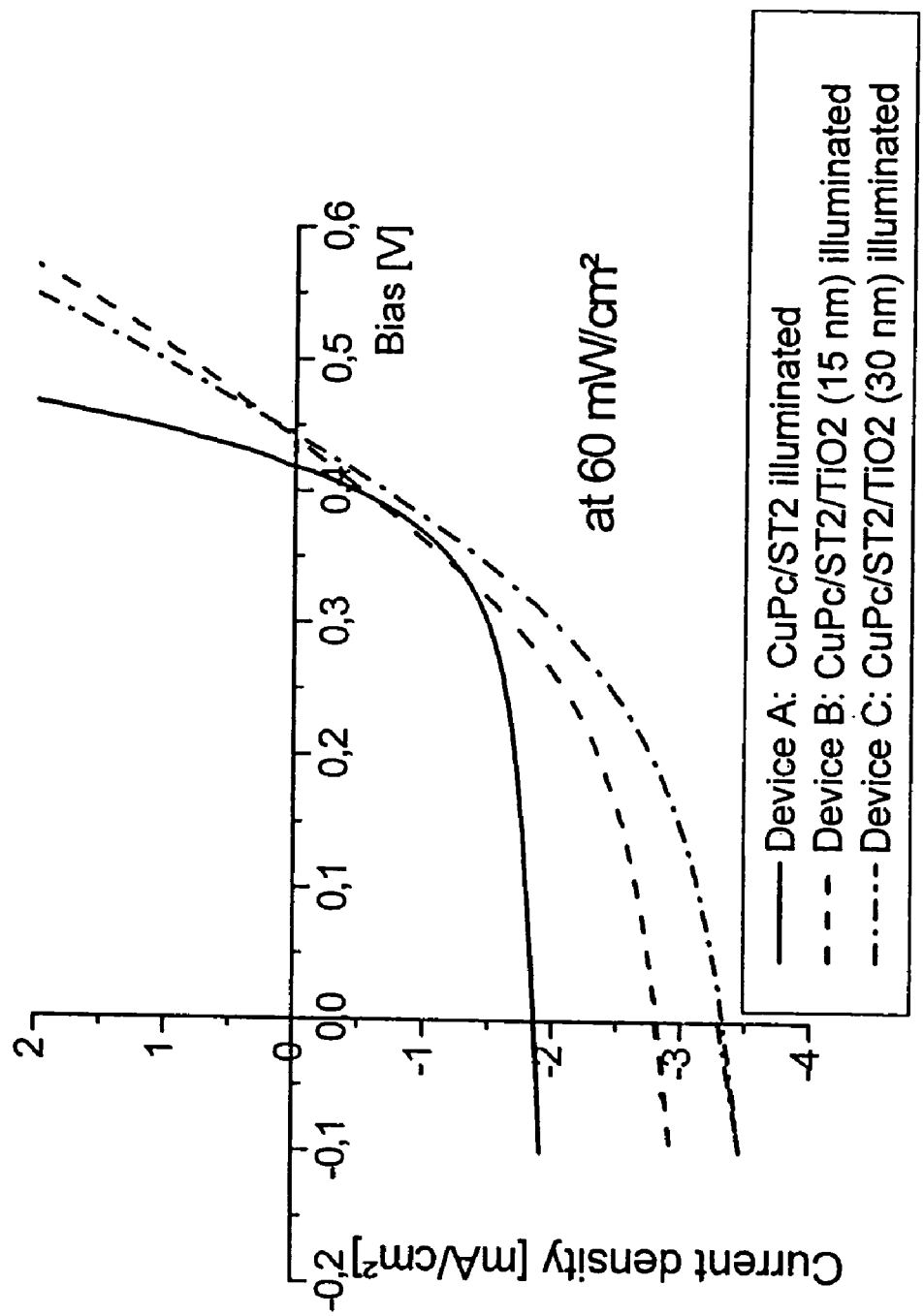
Figure 6:
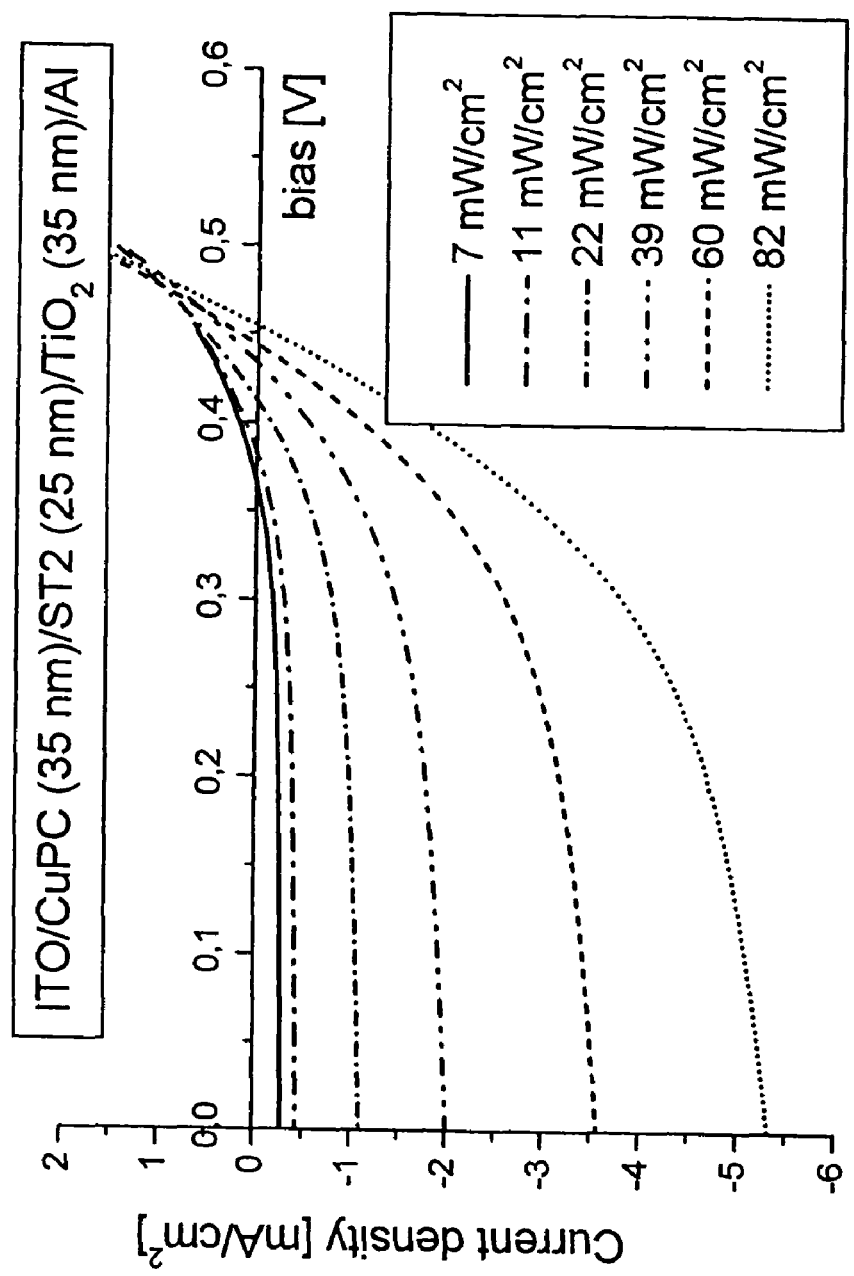

The method according to the present invention shall now be further explained with reference to the figures in which FIG. 1 shows a schematic outline of the composition of different hybrid solar cell prepared according to the invention, FIG. 2 shows a schematic outline of the preparation of a layer thickness gradient, FIG. 3 shows a schematic outline of the preparation of a hybrid solar cell prepared according to the invention, in which a cell was produced having a TiO$_2$ gradient, in which the substrate/EM carrier is schematically shown at (1), the HTM layer at (2), the substrate/EM/HTM carrier at (3), the dye layer at (4), the substrate/EM/HTM/dye carrier at (5), the mask at (6) and the TiO$_2$ gradient layer at (7), FIG. 4 shows an SEM of a cross section of a cell produced according to the invention showing the structure Substrate (1)+EM (2)/HTM (3)+dye (4)/SOL (5)/EM (6), FIG. 5 shows the current-voltage curves of hybrid organic solar cells with different TiO$_2$ layer thickness, and FIG. 6 shows current-voltage curves showing the light intensity dependence of I$_{sc}$ and V$_{oc}$ of a hybrid organic solar cell according to the invention.

EXAMPLE 1

Preparation of a Cell According to the Invention

In a first step according to FIG. 3, commercially available EM coated glass (1) is used as starting material. Suited EM materials are all materials which can be used to create transparent electrodes, like indium tin oxid, fluorine doped tin oxide, zinc oxide or doped zinc oxide. Further, an evaporated metal electrode (EM layer) selected from metals, like Au, Al, Ca or Mg, or combinations of metals like Al/Li, Mg/Ag, and the like can be used. In order to allow a proper function of the solar cell according to the invention, at least one of the EM-layers should be a TCO.

The starting material is then coated with a constant thickness layer of HTM (2), which can be applied by vapour deposition, resulting in a HTM-coated device substrate/TCO/HTM (3). Suitable HTM materials can be selected from the group of phthalocyanine and derivatives thereof (with or without a central atom or group of atoms), metal-free and metal containing porphyrins and derivatives thereof, TPD derivatives, triphenylamine and its derivatives, (including different ground structure as TDATAs, TTABs, TDABs, and cyclic variations like N-carbazoles and its derivatives), thiophenes, polythiophenes and derivatives thereof, polyanilines and derivatives thereof and hexabenzocoronene and its derivatives. In general, all kinds of hole transport materials known to the person skilled in the art can be used.

For example, CuPc or its derivatives can be used having the following formula:

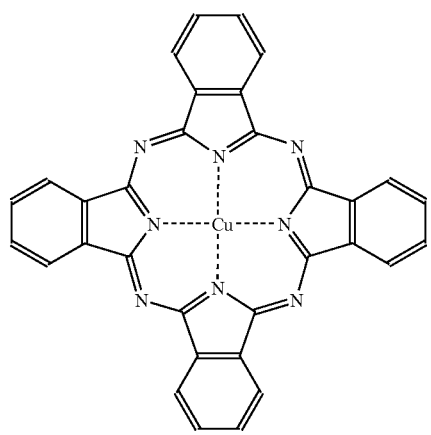

Further suited hole transporting agents are in principle disclosed in European patent application EP 00 111 493.3 [not yet published] and EP 0 901 175 A2, whose disclosures are incorporated herein by reference.

More particularly, EP 0 901 175 A2 discloses suited organic hole conducting agents which include aromatic diamine compounds having connected tertiary aromatic amine units of 1,-bis(4-(di-p-tolylamino)phenyl)-cyclohexane as described in JP-A 194393/1984, aromatic diamines containing two or more tertiary amines and having two or more fused aromatic rings substituted on the nitrogen atoms as typified by 4,4-bis[(N–1-naphthyl)-N-phenylamino]-biphenyl as described in JP-A 234681/1983, aromatic trimers having a starburst structure derived from triphenylbenzene as described in U.S. Pat. No. 4,923,774, aromatic diamines such as N,N'-diphenyl-N,N'-bis(3-methyphenyl)-(1,1'-biphenyl) 4,4'diamine as described in U.S. Pat. No. 4,764,625, α,α,α', α'-tetramethyl-α,α'-bis(4-di-p-tolylaminophenyl)-p-xylene as described in JP-A269084/1991, triphenylamine derivatives whose molecule is sterically asymmetric as a whole as described in JP-A 129271/1992, compounds having a plurality of aromatic diamino groups substituted on a pyrenyl group as described in JP-A 175395/1992, aromatic diamines having tertiary amine units connected through an ethylene group as described in JP-A 264189/1992, aromatic diamines having a styryl structure as described in JP-A 290851/1992, starburst type aromatic triamines as described in JP-A 308688/1992, benzyl-phenyl compounds as described in JP-A 364153/1992, compounds having tertiary amine units connected through a fluorene group as described in JP-A 25473/1993, triamine compounds as described in JP-A 239455/1993, bis-dipyridylaminobiophenyl compounds as described in JP-A 320634/1993, N,N,N-triphenylamine derivatives as described in JP-A 1972/1994, aromatic diamines having a phenoxazine structure as described in JP-A 290728/1993, diaminophenylanthridine derivatives as described in JP-A 45669/1994, and other carbazole derivatives.

Other hole transporting agents which are disclosed in EP 0 901 175 and which may be used in the present invention, include hydrazoen compounds (JP-A 311591/1990), silazane compounds (U.S. Pat. No. 4,950,950), silanamine derivatives (JP-A 49079/1994), phosphamine derivatives (JP-A 25659/1994), quinacridone compounds, stilbene compounds such as 4-di-p-tolylamino-stilbene and 4-(di-p-tolylamino)-4'-[4-di-p-tolylamino)-styryl]stilbene, triazole derivatives, oxadiazole derivatives, imidazole derivatives, polyarylalkane derivatives, pyrazoline derivatives, pyrazolone derivatives, oxadiazole derivatives, imidazole derivatives, polyarylalkane derivatives, pyrazoline derivatives, amino-substituted chalcone derivatives, oxazole derivatives, styrylanthracene derivatives, fluorenone derivatives and polysilane derivatives. These compounds may be used alone or in admixture of two or more. The same applies also to the other compounds disclosed herein, including those incorporated herein by reference.

In addition to the aforementioned compounds, polymers can be used as the hole transporting agent. Suitable polymers include polyvinyl carbazole and polysilanes (Appl. Phys. Lett., vol. 59, 2760, 1991), polyphosphazenes (JP-A 310949/1993), polyamides (JP-A 10949/1993), polyvinyl triphenylamine (Japanese Patent Application No. 133065(1993), polymers having a triphenylamine skeleton (JP-A 133065/1992), polymers having triphenylamine units connected through a methylene group (Synthetic Metals, vol 55-57, 4163, 1993) and polymethacrylates containing aromatic amine (J.Polym. Sci., Polym. Chem. Ed., vol 21, 969, 1983). When polymers or mixtures thereof are used as the hole transporting agent, they preferably have a number average molecular weight of at least 1,000, more preferably at least –5,000.

In a second step according to FIG. 3, constant thickness layers of a dye (4) are vapour deposited on the substrate/EM/HTM carrier (3), in this case dyes named ST1/1 (N,N'-dimethyl-3,4:9,10-perylene-bis(carboximid) or ST2 (Bisbenzimidazol[2,2-a:1',2'-b'] ]antra[2, 1,9-def:6,5,10-d'e'f'] diisoquinoline-6,11-dione) (both commercially available from Syntec Company) are used. In our experiments, we tested the different dyes in a layer thickness in the range from 5 to 50 nm. In general, suited dyes are, for example, di- or mono-substituted perylenes with all possible substituents. For the structure of dyes, all types of perylene diimides with different amino residues and all types of perylene benzimidazoles with different diamine components can be added. Moreover, the perylene rest can be differently substituted.

The general structure of perylene diimidazole is shown in the following formula

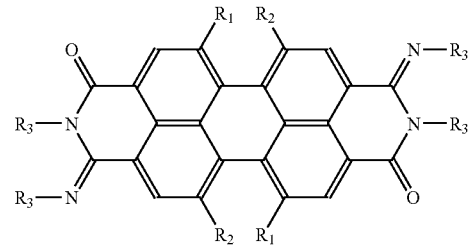

in which $R_1$, $R_2$, $R_3$ are alkyl, aryl alkoxyl or halogen, etc.

The general structure of perylene diimide is shown in the following formula

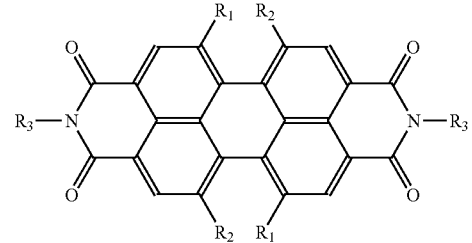

in which $R_1$, $R_2$, $R_3$ are alkyl, aryl, alkoxyl, or halogen, etc.

The inorganic oxide layer or electrode transport layer can consist of all kinds of semiconducting oxides as $TiO_2$, $SnO_2$, ZnO, $Sb_2O_3$, PbO, etc.

In a third step according to FIG. 3, in this embodiment a step gradient of titanium dioxide (7) is evaporated on the substrate/EM/HTM/dye carrier (5) using a mask (6). In addition to the variation of the titanium dioxide layer described for this embodiment, similar strategies can be used in order to produce other embodiments with gradients for all materials possible to be used as EM, HTM, dye or SOL. Titanium dioxide was evaporated from a tantalum crucible starting with $Ti_3O_5$ powder (pellets commercially available from Balzers); the vacuum chamber was evacuated to a pressure of $2.0 \times 10^{-5}$ mbar followed by feeding $O_2$ into the vacuum deposition chamber via a needle valve resulting in an $O_2$ partial pressure of $2.5 \times 10^{-4}$ mbar (possible partial pressures are in the range of $2.0 \times 10^{-5}$ to $3.0 \times 10^{-4}$ mbar). The crucible—substrate distance was 36 cm. The evaporation rates were controlled to be in the range between 0.11 to 0.5 nm/s. The evaporation rates were detected with oscillating quartz crystals placed inside the evaporation chamber. The production of the gradient is also schematically depicted in FIG. 2.

Finally, 24 Al stripes were applied as electrodes on top of the resulting hybrid organic solar cells having (in this embodiment) the structure:
Substrate+ITO/CuPc (35 nm)/ST2 (25 nm)/TiO$_2$(0, 15 or 35 nm)/Al FIG. 4 shows an SEM of a cross section of the cell produced according to the invention in which the substrate is glass (1) on which a layer of ITO (2), a layer of both CuPc (35 nm, (3)) and ST2 (25 nm (4)), a layer of TiO$_2$ (5) and a layer of Al (6) is applied.

EXAMPLE 2

Characteristics of a Cell Prepared According to the Invention

The hybrid organic solar cell produced according to example 1 was-tested for its current-voltage characteristics and light intensity dependence of $I_{sc}$ and $V_{oc}$. An Oriel 75W xenon short arc lamp with a water filter, a 345 nm sharp edge filter, a mirror and a PP diffuser was used as the light source. Current-voltage characteristics were measured with an SMU Keithley 2400, an IEEE-card together with a self-developed Labview measuring program (I[A], V[V], $I_{dens}$ [mA/cm$^2$], FF[%], $P_{max}$[mW/cm$^2$], $\eta$[%]. Standard measurement parameters were: ambient conditions, 60 mW/cm$^2$ to 100 mW/cm$^2$, a cycle of 0 V to −0.1 V to +1.0 V (illuminated dark), a 5 mA step size and 3 seconds delay time. The results of the measurements are graphically depicted in FIGS. 5 and 6 and listed in Tables 1 and 2, below.

TABLE 1

Current-voltage characteristics

| Device | $I_{sc}$ [mA/cm$^2$] | $V_{oc}$ [mV] | FF [%] | $\eta$ [%] |
| --- | --- | --- | --- | --- |
| A (0 nm TiO$_2$) | 1.861 | 420 | 57.6 | 0.75 |
| B (15 nm TiO$_2$) | 2.816 | 440 | 42.5 | 0.87 |
| C (35 nm TiO$_2$) | 3.326 | 440 | 42.4 | 1.04 |

The results show, that the introduction of a vapor-deposited layer of TiO$_2$ clearly increases the efficiency of the hybrid solar cell up to a value of $\eta$>1%.

TABLE 2

Light intensity dependence of $I_{sc}$ and $V_{oc}$ for device C (35 nm TiO$_2$)

| Light Int. [mW/cm$^2$] | $I_{sc}$ [mA/cm$^2$] | $V_{oc}$ [mV] | FF [%] | $\eta$ [%] |
| --- | --- | --- | --- | --- |
| 7 | 0.280 | 375 | 52.3 | 0.79 |
| 11 | 0.438 | 385 | 53.4 | 0.82 |
| 22 | 1.101 | 415 | 51.7 | 1.07 |
| 39 | 2.008 | 435 | 49.9 | 1.12 |
| 60 | 3.572 | 445 | 49.1 | 1.30 |
| 82 | 5.319 | 455 | 47.3 | 1.40 |

The results show a value of $\eta$=1.30% at 60 mW/cm$^2$, indicating the good efficiency of the inventive hybrid organic solar cell.

The invention claimed is:

1. Method for the production of a hybrid organic solar cell having the general structure
Substrate +EM/HTM/dye/SOL/EM, or
Substrate +EM/SOL/dye/HTM/EM, in which
EM is an electrode material, selected from the group consisting of a transparent conductive oxide (TCO) and metal, with at least one of the EM layers of the cell being a TCO,
HTM is a hole transport material,
SOL is a semiconducting oxide layer,
"dye" means a suited dye,
comprising vapor-deposition of the SOL of the hybrid organic solar cell, and further comprising co-evaporation of the HTM layer and the dye layer.

2. Method according to claim 1, comprising additional deposition or vapor-deposition of a layer of lithium fluoride close to EM interfaces either on one side or both sides.

3. Method according to claim 1, comprising increasing the surfaces of the interfaces of the layers by use of structured indium tin oxide, or dye/TiO$_2$ or co-evaporation of HTM and a dopant.

4. Method according to claim 1, wherein the substrate is selected from the group consisting of glass, coated glass, polymeric foils, norbornene-based foils, SnO$_2$-coated metal foils and stainless steel foils, wherein said polymeric foils are made from PET, PEN or PI.

5. Method according to claim 1, wherein the substrate is flexible.

6. Method according to claim 1, wherein the TCO is selected from the group consisting of indium tin oxide, fluorine doped tin oxide, zinc oxide, and metal-doped zinc oxide, wherein said metal is selected from the group consisting of Au, Al, Ca, and Mg or a combination thereof.

7. Method according to claim 1, wherein the TCO is indium tin oxide.

8. Method according to claim 1, wherein the HTM is selected from the group consisting of phthalocyanine and derivatives thereof (with or without a central atom or group of atoms), metal-free and metal containing porphyrins and derivatives thereof, TPD derivatives, triphenylamine and its derivatives, (including different ground structure as TDATAs, TTABs, TDABs, and cyclic N-carbazole variations and its derivatives), thiophenes, polythiophenes and derivatives thereof, polyanilines and derivatives thereof and hexa-benzo-coronene and its derivatives, triphenyldiamine derivatives, aromatic diamine compounds having connected tertiary aromatic amine units of 1,-bis(4-(di-p-tolylamino) phenyl)-cyclohexane, aromatic diamines containing two or more tertiary amines and having two or more fused aromatic rings substituted on the nitrogen atoms, aromatic trimers having a starburst structure derived from triphenylbenzene, aromatic diamines, triphenylamine derivatives whose molecule is sterically asymmetric as a whole, compounds having a plurality of aromatic diamino groups substituted on a pyrenyl group, aromatic diamines having tertiary amine units connected through an ethylene group, aromatic diamines having a styryl structure, starburst type aromatic triamines, benzylphenyl compounds, compounds having tertiary amine units connected through a fluorene group, triamine compounds, bisdipyridylaminobiphenyl compounds, N,N,N-triphenylamine derivatives, aromatic diamines having a phenoxazine structure, diaminophenylanthridine, and other carbazole derivatives, hydrazoen compounds, silazane compounds, silanamine derivatives, phosphamine derivatives, quinacridone compounds, stilbene compounds, triazole derivatives, oxadiazole derivatives, imidazole derivatives, polyarylalkane derivatives, pyrazoline derivatives, pyrazolone derivatives, oxadiazole derivatives, imidazole derivatives, polyarylalkane derivatives, pyrazoline derivatives, amino-substituted chalcone derivatives, oxazole derivatives, styrylanthracene derivatives, fluorenone derivatives and polysilane derivatives, all compounds alone or in admixture of two or more, polymers, polyphosphazenes, polyamides, polyvinyl triphenylamine, polymers having a triphenylamine skeleton, polymers having triphenylamine units connected through a methylene group and polymethacrylates containing aromatic amine.

9. Method according to claim 1, wherein the HTM is copper-phthalocyanine (CuPc).

10. Method according to claim 1, wherein the SOL is a semiconducting oxide selected from the group consisting of $TiO_2$, $SnO_2$, ZnO, $Sb_2O_3$, and PbO.

11. Method according to claim 1, wherein the SOL is $TiO_2$.

12. Method according to claim 1, wherein the dye is selected from the group consisting of di- or monosubstituted perylenes with all possible substituents, terrylene, quinacridone, anthraquinone, nealred, titanylphthalocyanine, porphines and porphyrines and derivatives thereof, polyfluorenes and derivatives thereof and azo-dyes.

13. Method according to claim 1, wherein the dye is deposited in a layer having a thickness of about 5 to about 65 nm and the SOL is deposited in a thickness of about 5 to about 50 nm.

14. Method according to claim 1, wherein more than one dye is used in one cell.

15. Method according to claim 1, wherein the substance of the HTM is doped.

16. Method according to claim 8, wherein said HTM is an aromatic diamine containing two or more tertiary amines and having two or more fused aromatic rings substituted on the nitrogen atoms and is 4,4-bis[(N-1-naphthyl)-N-phenylamino]-biphenyl.

17. Method according to claim 8, wherein said HTM is an aromatic diamine and is N,N'-diphenyl-N,N'-bis(3-methyphenyl)-(1,1'-biphenyl)-4,4' diamine, $\alpha,\alpha,\alpha',\alpha'$-tetramethyl-$\alpha,\alpha'$-bis(4-di-p-tolylaminophenyl)-p-xylene.

18. Method according to claim 8, wherein said HTM is a stilbene compounds and is 4-di-p-tolylamino-stilbene and 4-(di-p-tolylamino)-4'-[4-di-p-tolylamino)-styryl]stilbene.

19. Method according to claim 8, wherein said HTM is a polymer selected from the group consisting of polyvinyl carbazole and polysilanes.

20. Method according to claim 8, wherein when said HTM is a polymer and said polymer has an average molecular weight of at least 1,000 Da.

21. Method according to claim 8, wherein when said HTM is a polymer and said polymer has an average molecular weight of at least 5,000 Da.

22. Method according to claim 12, wherein when said dye is a di- or monosubstituted perylene and said dye is selected from the group consisting of perylene anhydride, perylene dianhydrides, perylene imides, perylene diimides, perylene imidazoles, perylene diimidazoles and derivatives thereof.

23. Method according to claim 6, wherein said metal is a combination of metals selected from the group consisting of Al/Li and Mg/Ag.

* * * * *